United States Patent
Nelson et al.

(10) Patent No.: US 10,068,874 B2
(45) Date of Patent: Sep. 4, 2018

(54) METHOD FOR DIRECT INTEGRATION OF MEMORY DIE TO LOGIC DIE WITHOUT USE OF THRU SILICON VIAS (TSV)

(71) Applicant: Intel Corporation, Santa Clara, CA (US)

(72) Inventors: Donald W. Nelson, Beaverton, OR (US); M Clair Webb, North Logan, UT (US); Patrick Morrow, Portland, OR (US); Kimin Jun, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/122,630

(22) PCT Filed: Jun. 16, 2014

(86) PCT No.: PCT/US2014/042574
§ 371 (c)(1),
(2) Date: Aug. 30, 2016

(87) PCT Pub. No.: WO2015/195082
PCT Pub. Date: Dec. 23, 2015

(65) Prior Publication Data
US 2017/0069598 A1 Mar. 9, 2017

(51) Int. Cl.
*H01L 23/34* (2006.01)
*H01L 25/065* (2006.01)
(Continued)

(52) U.S. Cl.
CPC ...... *H01L 25/0652* (2013.01); *H01L 23/5383* (2013.01); *H01L 23/5384* (2013.01);
(Continued)

(58) Field of Classification Search
CPC ............ H01L 23/5383; H01L 23/5384; H01L 23/5389; H01L 25/0652
(Continued)

(56) References Cited

U.S. PATENT DOCUMENTS 5,870,289 A * 2/1999 Tokuda ............... H01L 21/6835
174/260
6,635,970 B2 * 10/2003 Lasky ................... H01L 23/481
257/685

(Continued)

FOREIGN PATENT DOCUMENTS

JP 2012527127 11/2012
JP 2012529770 11/2012
(Continued)

OTHER PUBLICATIONS

Intel Corporation, "International Preliminary Report on Patentability and Written Opinion", PCT/US2014/042574, (dated Dec. 29, 2016).
(Continued)

*Primary Examiner* — Nitin Parekh
(74) *Attorney, Agent, or Firm* — Schwabe, Williamson & Wyatt, P.C.

(57) ABSTRACT

A method including forming a first substrate including an integrated circuit device layer disposed between a plurality of first interconnects and a plurality of second interconnects; coupling a second substrate including a memory device layer to the first substrate so that the memory device layer is juxtaposed to one of the plurality of first interconnects and the plurality of second interconnects; and removing a portion of the first substrate. An apparatus including a device layer including a plurality of circuit devices disposed between a plurality of first interconnects and a plurality of second interconnects on a substrate; a memory device layer including a plurality of memory devices juxtaposed and
(Continued)

coupled to one of the plurality of first interconnects and the plurality of second interconnects; and contacts points coupled to one of ones of the first plurality of interconnects and ones of the second plurality of interconnects.

5 Claims, 7 Drawing Sheets

(51) Int. Cl.
  *H01L 23/538*  (2006.01)
  *H01L 23/00*  (2006.01)
  *H01L 25/00*  (2006.01)
(52) U.S. Cl.
  CPC .......... *H01L 23/5389* (2013.01); *H01L 24/03* (2013.01); *H01L 24/06* (2013.01); *H01L 24/17* (2013.01); *H01L 25/50* (2013.01); *H01L 2224/16225* (2013.01); *H01L 2924/0002* (2013.01); *H01L 2924/1436* (2013.01)
(58) Field of Classification Search
  USPC ........................................................ 257/723
  See application file for complete search history.

(56) References Cited

U.S. PATENT DOCUMENTS

| | | | | |
|---|---|---|---|---|
| 6,661,098 B2* | 12/2003 | Magerlein | ............... | H05K 1/112 257/678 |
| 6,732,908 B2* | 5/2004 | Furman | ................. | H01L 21/288 228/180.22 |
| 6,819,000 B2* | 11/2004 | Magerlein | ............... | H05K 1/112 257/678 |
| 6,962,872 B2* | 11/2005 | Chudzik | ................. | H01L 23/50 257/E23.079 |
| 8,164,171 B2 | 4/2012 | Lin et al. | | |
| 8,227,904 B2 | 7/2012 | Braunisch et al. | | |
| 8,716,065 B2* | 5/2014 | Chi | ..................... | H01L 23/3135 257/686 |
| 2005/0145141 A1* | 7/2005 | Nguyen | ................. | C04B 28/02 106/724 |
| 2005/0218521 A1 | 10/2005 | Lee | | |
| 2006/0138647 A1* | 6/2006 | Crisp | ...................... | H01L 24/73 257/723 |
| 2008/0136004 A1* | 6/2008 | Yang | ........................ | H01L 24/96 257/686 |
| 2008/0315387 A1* | 12/2008 | Gerber | .................. | H01L 25/162 257/686 |
| 2009/0224364 A1 | 9/2009 | Oh et al. | | |
| 2010/0081232 A1 | 4/2010 | Furman et al. | | |
| 2010/0290191 A1* | 11/2010 | Lin | .................... | H01L 23/49816 361/704 |
| 2010/0314711 A1 | 12/2010 | Farooq et al. | | |
| 2012/0161331 A1* | 6/2012 | Gonzalez | ................ | H01L 24/19 257/774 |
| 2013/0021060 A1 | 1/2013 | Or-Bach | | |
| 2013/0062504 A1 | 3/2013 | Sukegawa et al. | | |
| 2013/0168674 A1 | 7/2013 | Franzon et al. | | |
| 2013/0270682 A1* | 10/2013 | Hu | ........................... | H01L 24/11 257/666 |
| 2013/0292840 A1 | 11/2013 | Shoemaker | | |
| 2013/0307513 A1* | 11/2013 | Then | ................. | H01L 29/66469 323/311 |
| 2014/0117470 A1 | 5/2014 | Baskaran et al. | | |
| 2015/0364524 A1* | 12/2015 | Kadow | .................. | H01L 27/16 327/512 |

FOREIGN PATENT DOCUMENTS

| | | |
|---|---|---|
| JP | 2012-253358 | 12/2012 |
| JP | 2013530511 | 7/2013 |

OTHER PUBLICATIONS

Intel Corporation, "Office Action", TW Application No. 104114583, (dated Jun. 30, 2016).
Intel Corporation et al., "International search report and written opinion", PCT/US2014/042574, (dated Mar. 17, 2015).
Extended European Search Report for European Patent Application No. 14895276.5 dated Jan. 26, 2018, 10 pgs.
Notice of Allowance for Taiwan Patent Application No. 104114583 dated Sep. 29, 2016, 2 pgs., no English translation.
Office Action for Japanese Patent Application No. 2016-567258, dated Nov. 2, 2017, 5 pages.
Notice of Allowance for Japanese Patent Application No. 2016-567258, dated Feb. 27, 2018, 1 pages.

* cited by examiner

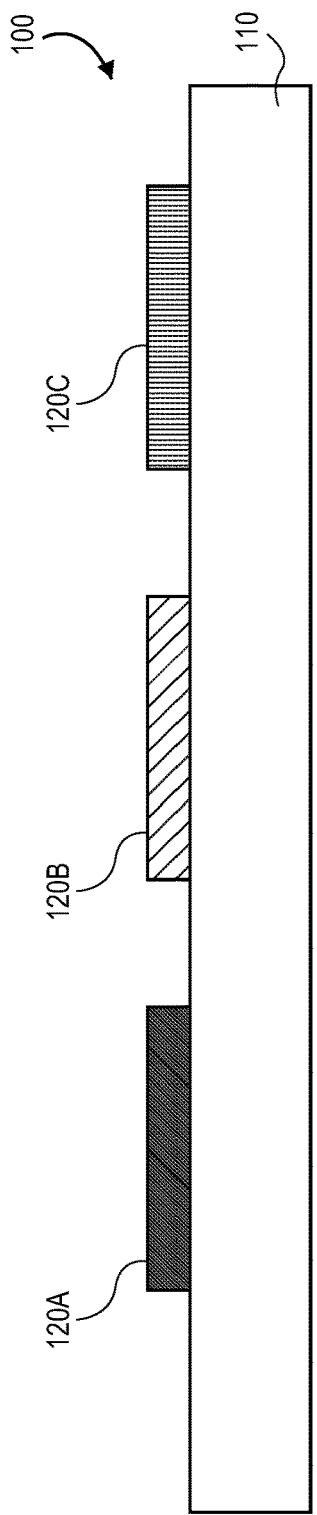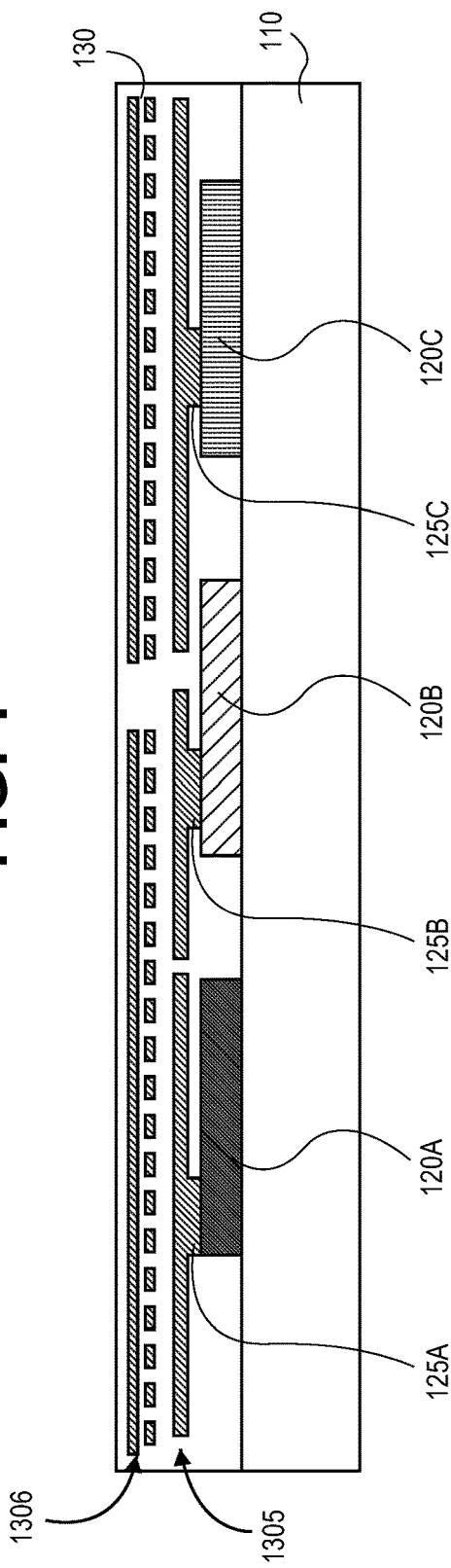

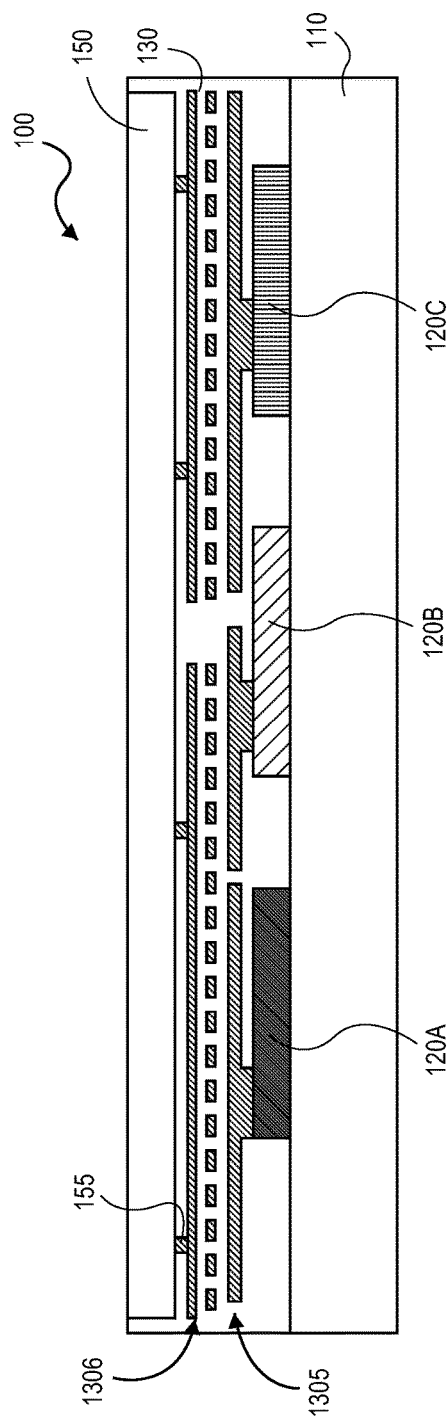
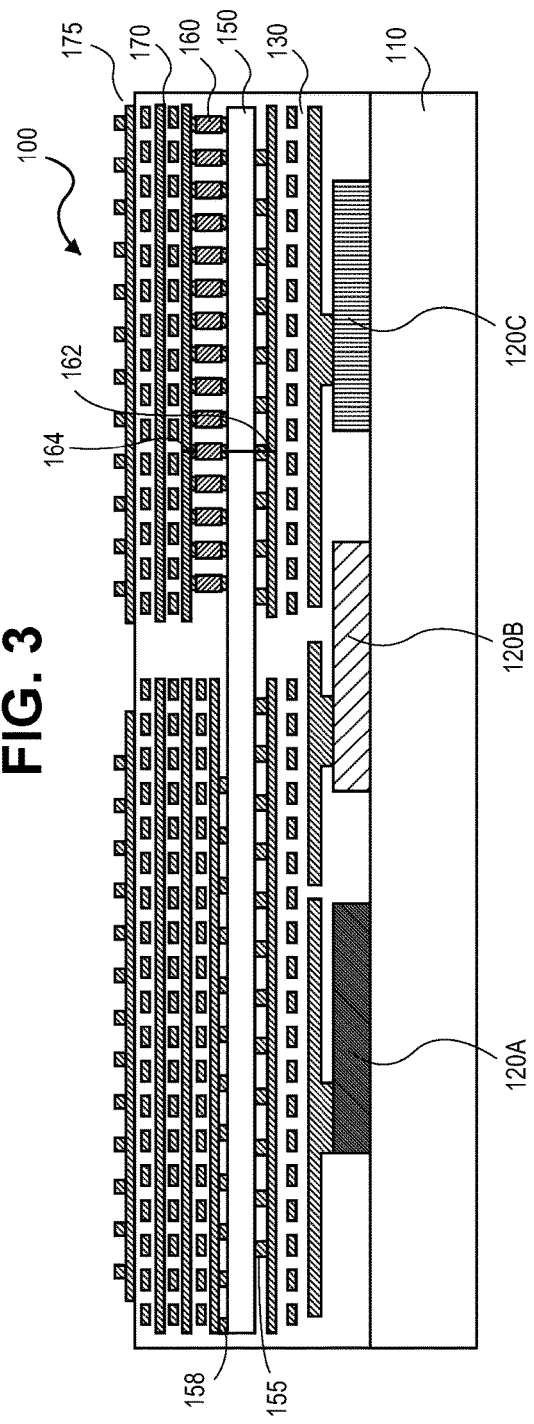

METHOD FOR DIRECT INTEGRATION OF MEMORY DIE TO LOGIC DIE WITHOUT USE OF THRU SILICON VIAS (TSV)

CROSS-REFERENCE TO RELATED APPLICATION

This patent application is a U.S. National Phase Application under 35 U.S.C. § 371 of International Application No. PCT/US2014/042574, filed Jun. 16, 2014, entitled METHOD FOR DIRECT INTEGRATION OF MEMORY DIE TO LOGIC DIE WITHOUT USE OF THRU SILICON VIAS (TSV).

BACKGROUND

Field

Integrated circuits and more particularly, monolithic three-dimensional integrated circuits.

Description of Related Art

Monolithic integrated circuits (ICs) generally include a number of transistors, such as metal oxide semiconductor field effect transistors (MOSFETs) fabricated over a planar substrate, such as a silicon wafer. Lateral scaling of IC dimensions is becoming more difficult with MOSFETs gate dimensions now below 20 nm. As device sizes continue to decrease, there will come a point where it becomes impractical to continue standard planar scaling. This inflection point could be due to economics or physics, such as prohibitively high capacitance, or quantum-based variability. Stacking of devices in a third dimension, typically referred to as vertical scaling, or three-dimensional (3D) integration, is a promising path toward greater transistor density.

One solution for integrating memory devices with logic devices is by incorporating a memory die with a logic die using through silicon vias (TSVs) that are disposed through the logic die to connect to the memory die. Another solution is wire bonding a logic die to a memory die. Both these solutions result in limited speed/bandwidth and a package height of at least two die.

BRIEF DESCRIPTION OF THE DRAWINGS

FIG. 1 shows the substrate of a single crystal silicon semiconductor substrate.

FIG. 2 shows the structure of FIG. 1 following the introduction of a plurality of interconnects juxtaposed to a substrate, where ones of the plurality of interconnects are connected to the devices.

FIG. 3 shows the structure of FIG. 2 following the introduction of a device layer onto the structure.

FIG. 4 shows the structure of FIG. 3 following the introduction of a plurality of interconnects on the structure.

DETAILED DESCRIPTION

Figure 5:
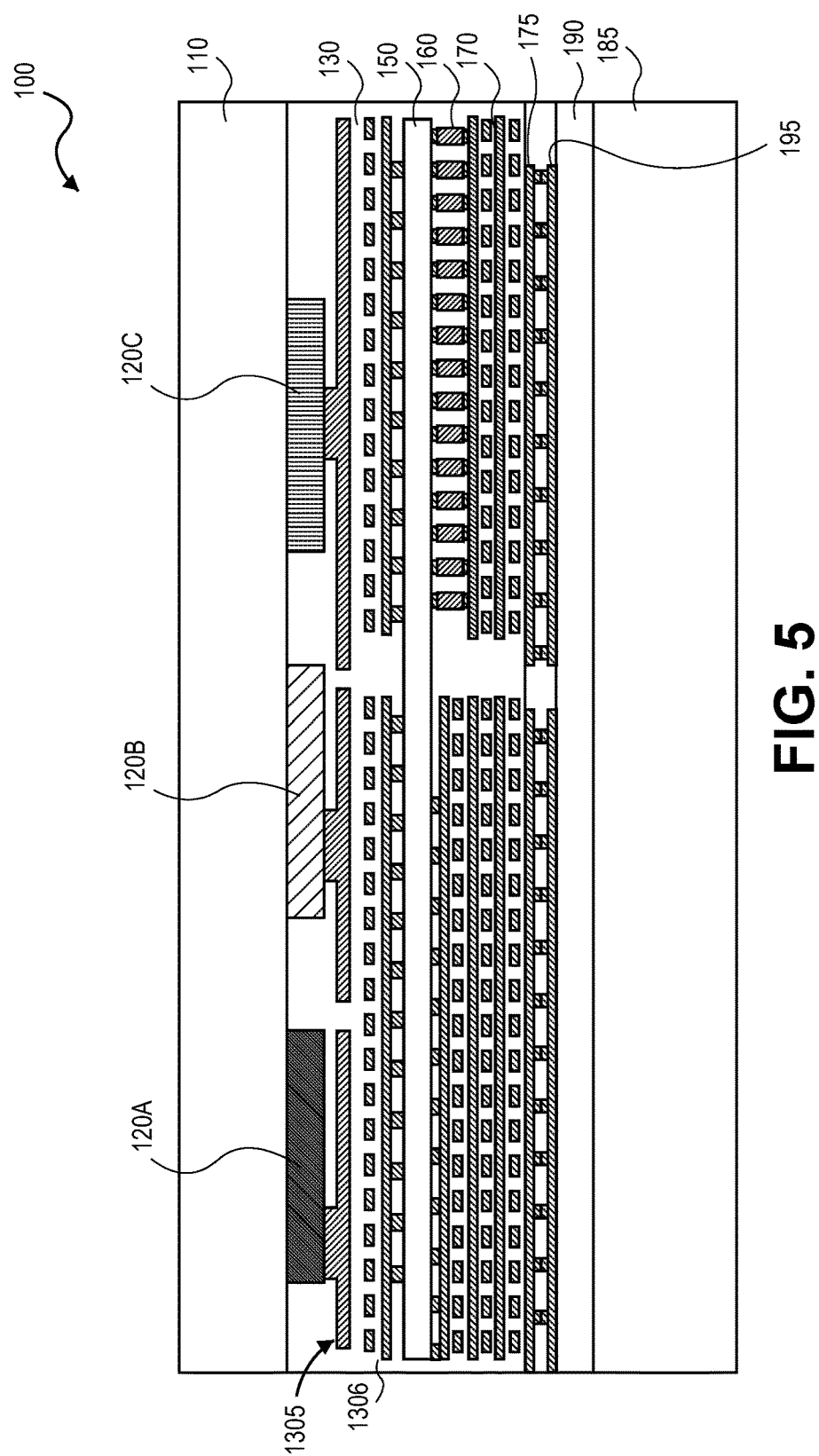
FIG. 5 shows the structure of FIG. 4 following the connection of the structure to a carrier wafer including a memory device layer.

An integrated circuit (IC) and a method of forming an IC and its use are disclosed. In one embodiment, a monolithic three-dimensional (3D) IC and its method of manufacture and use is described. In one embodiment, an apparatus of a three-dimensional integrated circuit includes a device layer including a plurality of circuit devices disposed between a plurality of first interconnects and a plurality of second interconnects on a substrate and a memory device layer including a plurality of memory devices connected to one of the plurality of first interconnects and the plurality of second interconnects and the circuit device. Accordingly, an apparatus is disclosed which directly attaches a memory device layer to at least one active circuitry (e.g., logic) layer. As described in the method directly attaching memory such as DRAM or other memory to active circuitry by way of a direct attach method provides high bandwidth that does not require speed limiting through silicon vias (TSVs). Instead, a memory device is integrated to a monolithic 3D IC structure, resulting in a single die solution. The integrated stack of active (e.g., logic) circuitry and memory circuitry in distinct layers provide a single die solution that also results in a thin package for applications where package height is at a premium.

In the following description, various aspects of the illustrative implementations will be described using terms commonly employed by those skilled in the art to convey the substance of their work to others skilled in the art. However, it will be apparent to those skilled in the art that embodiments may be practiced with only some of the described aspects. For purposes of explanation, specific numbers, materials and configurations are set forth in order to provide a thorough understanding of the illustrative implementations. However, it will be apparent to one skilled in the art that the embodiments may be practiced without the specific details. In other instances, well-known features are omitted or simplified in order not to obscure the illustrative implementations.

Various operations will be described as multiple discrete operations, in turn, in a manner that is most helpful in understanding the embodiments described herein, however, the order of description should not be construed to imply that these operations are necessarily order dependent. In particular, these operations need not be performed in the order of presentation.

Implementations may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope.

A plurality of transistors, such as metal-oxide-semiconductor field-effect transistors (MOSFET or simply MOS transistors), may be fabricated on the substrate such as in device layers as will be noted herein. In various implementations, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that embodiments may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations, the gate electrode may consist of a combination of U-shaped structures and planar, non-U-shaped structures. For example, the gate electrode may consist of one or more U-shaped metal layers formed atop one or more planar, non-U-shaped layers.

In some implementations, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIGS. 1-7 describe one method of forming a monolithic 3D IC including a memory device layer. The embodiment described also includes two circuit device layers (active circuitry layers) where one of the circuit device layers includes devices having different voltage ranges than devices in the other circuit device layer. Representatively, devices having a higher voltage range include, but are not limited to, devices operable for use with high frequency (e.g., radio frequency (RF)) and power switching applications. Exemplary of such devices are relatively large (e.g., older generation) p-type and/or n-type devices, high electron mobility transistors such as gallium nitride (GaN) or gallium arsenide (GaAs). Representatively, such devices can include devices that can withstand increased voltage and provide increased drive current. Such devices tend to be larger than state of the art logic devices. Lower voltage range, typically faster devices include logic devices such as FinFETs or other reduced formfactor devices that can be arranged on a device layer at a higher pitch than higher voltage range devices. In another embodiment, a monolithic 3D IC includes circuit device layers of similar devices or only one device layer (e.g., a logic device layer) or mixtures of device types.

Referring to FIG. 1, in one embodiment, high voltage swing devices and/or larger (e.g., older generation) PMOS and/or NMOS devices are formed on a substrate. FIG. 1 shows substrate 110 of, for example, a single crystal silicon semiconductor substrate (e.g., a silicon substrate). Disposed on substrate 110 is a device layer including devices 120A, 120B and 120C. Device 120A is, for example, a GaN device or GaAs device; device 120B is, for example, an older generation n-type device; and device 120C is representatively an older generation p-type device. Such devices may be used in high power applications.

FIG. 2 shows the structure of FIG. 1 following the introduction of a plurality of interconnects juxtaposed to substrate 110, where ones of the plurality of interconnects are connected to the devices. FIG. 2 shows plurality of interconnects 130 including interconnects 1305 having dimensions that are compatible (e.g., impedance matched) for relatively high voltage swing devices such as devices 120A, 120B and 120C. Plurality of interconnects 130 also includes interconnects 1306 that, in one embodiment, have dimensions different than the dimension of interconnects 1305. In one embodiment, plurality of interconnects 130 are a copper material and patterned as is known in the art. Device layer contacts 125A, 125B and 125C between the devices and a first level interconnect may be tungsten or copper and interlevel contacts between interconnects are, for example, copper. The interconnects are insulated from one another and from the devices by dielectric material (e.g., an oxide).

FIG. 3 shows the structure of FIG. 2 following the introduction of a device layer onto the structure. FIG. 3 shows device layer 150 juxtaposed to or on plurality of interconnects 130. In one embodiment, device layer 150 is a single crystal semiconductor layer (e.g., silicon layer) includes a layer that is introduced through a layer transfer process. Device layer 150 may or may not include devices at the time of transfer. In an embodiment where such layer does not include devices at the time of transfer, a plurality of devices may be formed post-transfer. Such devices include high speed devices such as high speed logic devices (e.g., FinFET devices). Such devices may be laid out or arranged at a finer pitch in device layer 150 than high voltage swing devices and/or larger (older generation) devices associated with the other device layer on structure 100 (e.g., device layer including devices 120A-120C). Such devices, in one embodiment, are connected to interconnects 1306 of plurality of interconnects 130 through, for example, contacts 155 between the device layer and the interconnect. Representatively, interconnects 1306 have a thickness on the order of at least 0.67 times a gate pitch and interconnects 1305 can have a thickness on the order of greater than 100 to 1000 times the thickness of interconnects 1306. Representatively, current FinFETs have a voltage range of zero to 1.5 volts. Higher voltage range devices, in one embodiment, are devices with voltage ranges greater than 1.5 volts, such as ranges up to 5.5 volts.

FIG. 4 shows the structure of FIG. 3 following the introduction of a plurality of interconnects on the structure. FIG. 4 shows the plurality of interconnects 170 juxtaposed to or on device layer 150 where ones of the plurality of interconnects 170 are connected to devices in device layer 150. As illustrated in FIG. 4, devices in device layer 150 may be connected to ones of plurality of interconnects 170 through contacts 158 and/or to ones of plurality of interconnects 130 through contacts 155. FIG. 4 also shows memory elements 160 embedded in plurality of interconnects 170. In one embodiment, memory elements (e.g., scalable two transistor memory (STTM) and/or resistive random access memory (ReRAM) elements) are connected at one end to plurality of interconnects 170 (through contact 164) and to device layer 150 and to plurality of interconnects 130 through contacts 162. Devices in device layer 150 are operable to enable a memory element during memory read and write operation.

FIG. 4 shows plurality of interconnects 170 isolated from one another and from the device layer by dielectric material as is known in the art. Plurality of interconnects 170 are selected, in one embodiment, from a material such as a copper introduced by a plating process with contacts 158 to devices in device layer 150 representatively being copper or tungsten and contacts between interconnects being copper. Disposed on plurality of interconnects 170 is metallization layer 175 that includes exposed conductive contact points for metal to metal bonding connections.

FIG. 5 shows the structure of FIG. 4 following the connection of the structure to a carrier wafer including a memory device layer. In one embodiment, structure 100 in FIG. 4 is inverted and bonded to a carrier wafer. FIG. 5 shows carrier wafer 185 of, for example, a silicon or other suitable substrate. Carrier wafer 185 includes, at one surface, memory device layer 190. Memory device layer 190 may be a number of plurality of memory elements and memory circuitry such as a dynamic RAM (DRAM) device layer. In one embodiment, memory device layer includes metallization layer 195 including conductive connection points or connections exposed and aligned to conductive contact points in metallization layer 175 of structure 100. Thus, in one embodiment, exposed contacts associated with memory device layer 190 may be connected to metallization 175 through direct metal to metal bonding (e.g., compression bonding of copper to copper).

Figure 6:
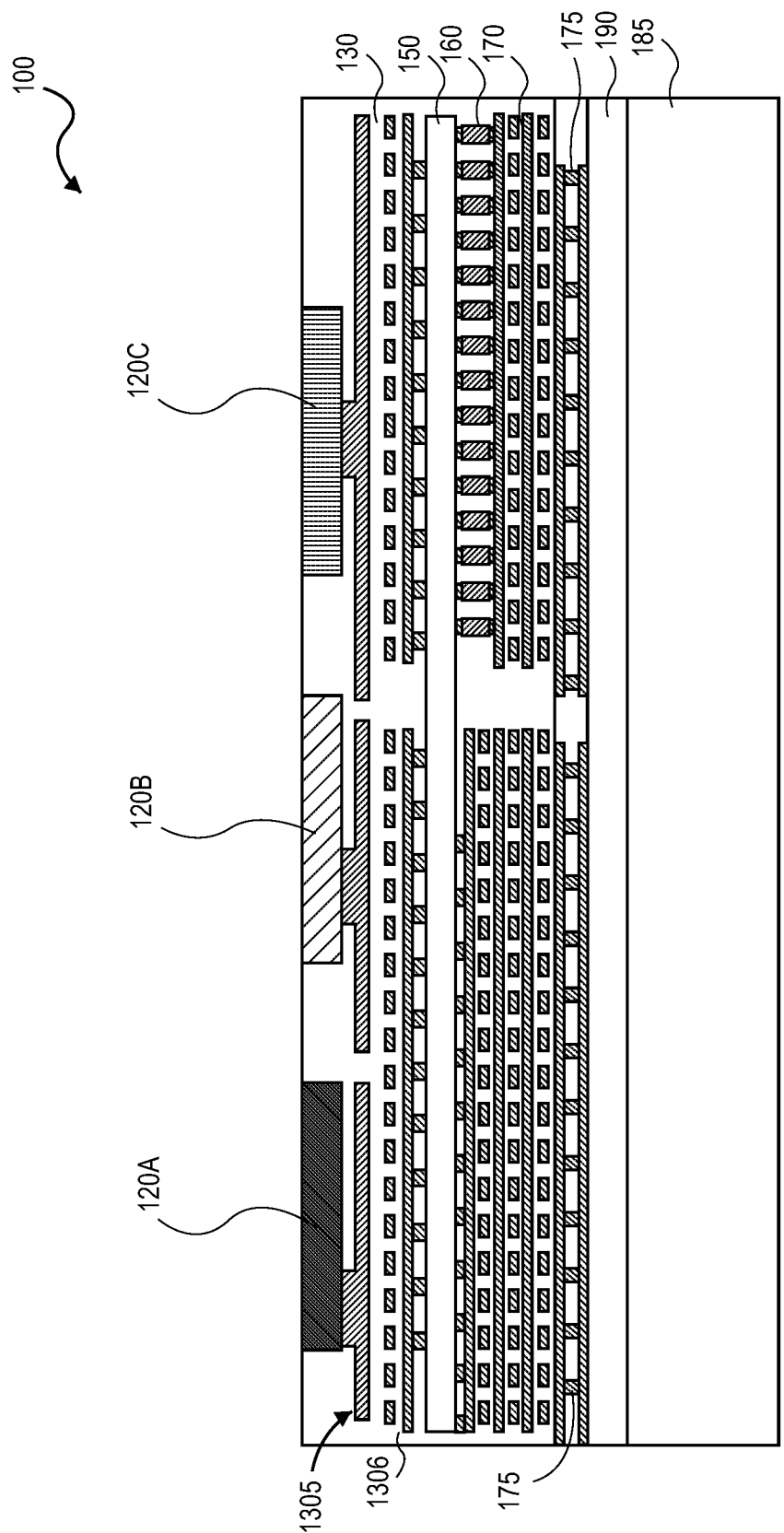
FIG. 6 shows the structure of FIG. 5 following the removal of substrate 110 from the structure.

FIG. 6 shows the structure of FIG. 5 following the removal of substrate 110 from the structure. In one embodiment, substrate 110 is removed by mechanical (e.g., grinding) or other mechanism (e.g., etch). Substrate 110 is removed to the extent that at least a device layer including, in this embodiment, devices 120A, 120B and 120C remain on the carrier wafer.

Figure 7:
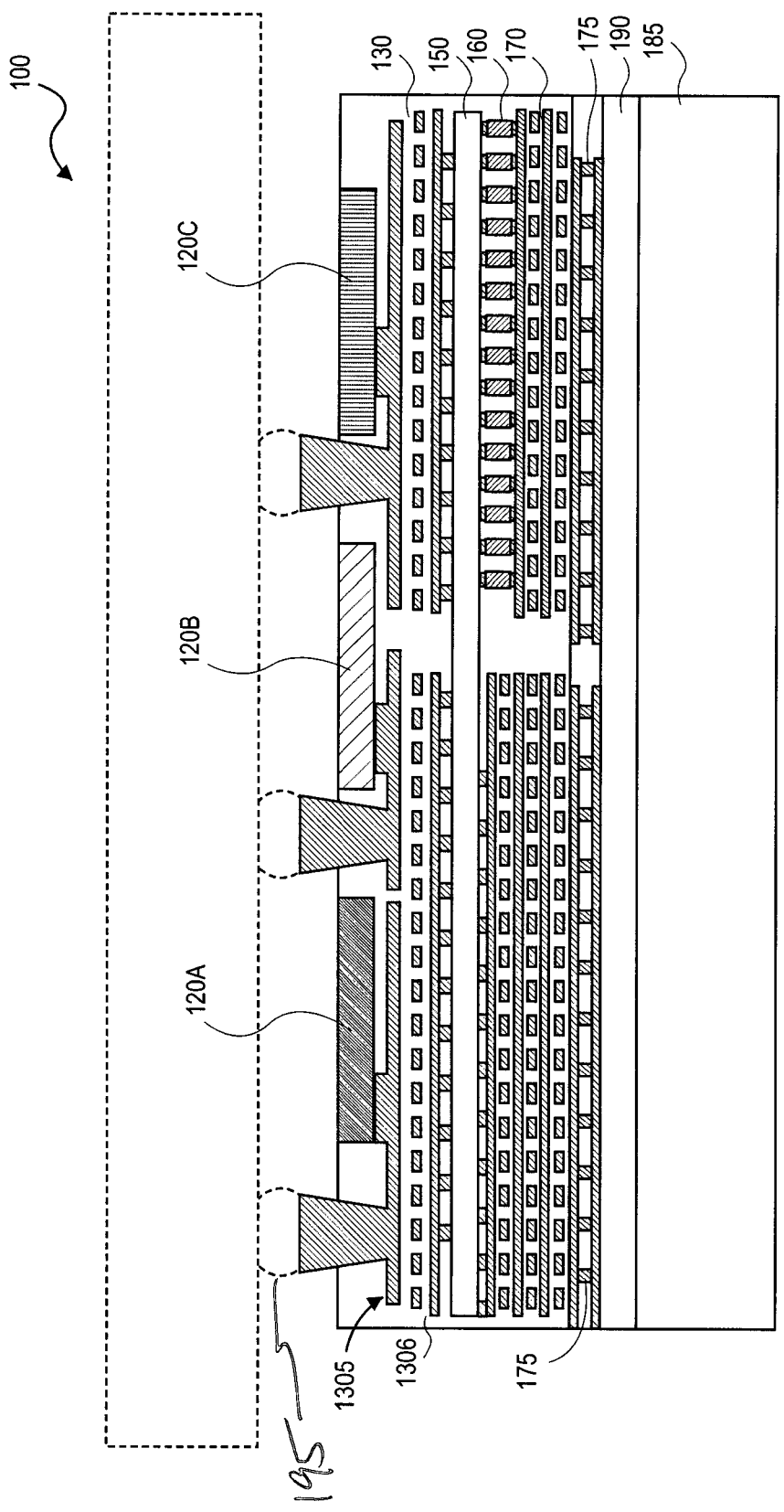
FIG. 7 shows the structure of FIG. 6 following the passivation of the device layer including devices.

FIG. 7 shows the structure of FIG. 6 following the passivation of the device layer including device 120A, device 120B and device 120C. Such passivation may be by way of an oxide layer or similar dielectric material layer. FIG. 7 also shows the formation of contact point 195 to ones of plurality of interconnects 130 (interconnect 1305). Contact points 195 may be used to connect structure 100 to a substrate such as a package substrate. Once formed, the structure if formed at a wafer level, may be singulated into a discreet monolithic 3D IC. FIG. 7 representatively shows structure 100 after singulation and illustrates in ghost lines the connection of the structure to a package substrate through solder connections to contact points 195.

Figure 8:
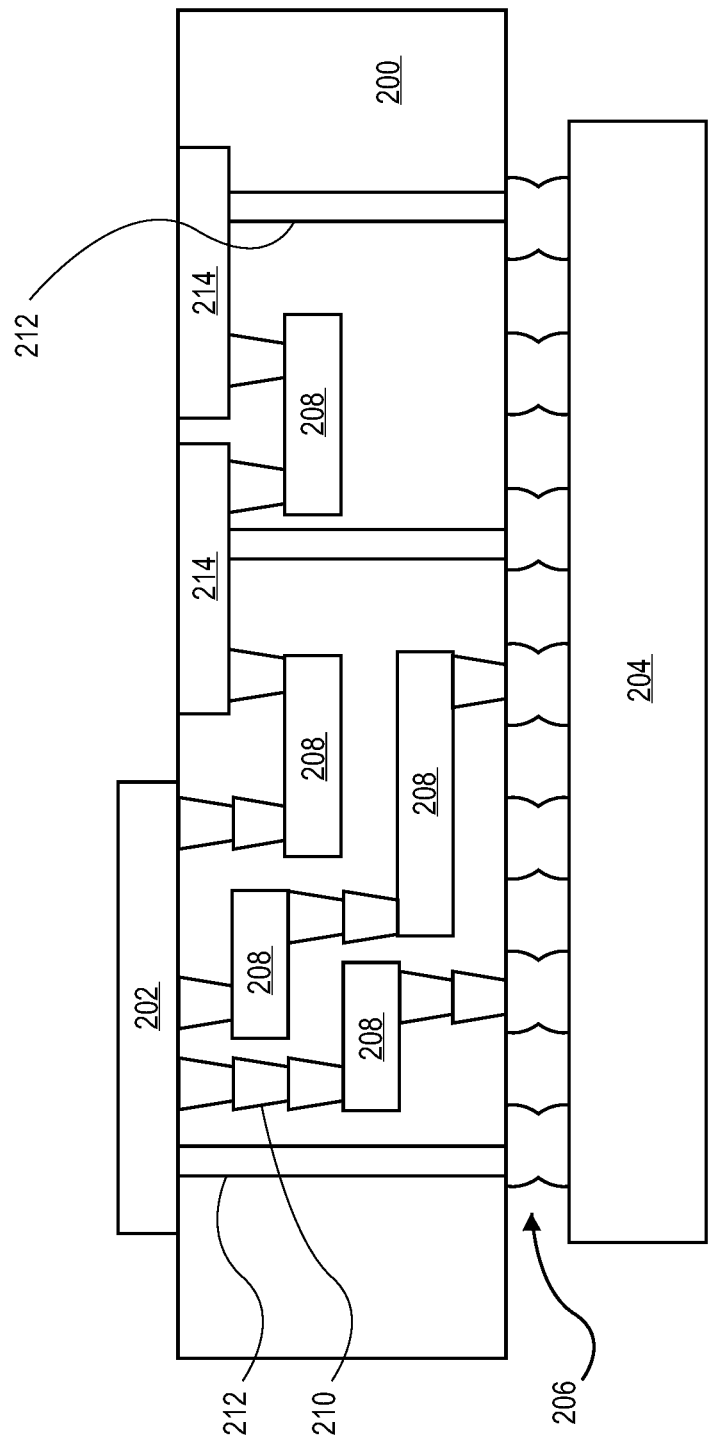
FIG. 8 is an interposer implementing one or more embodiments.

FIG. 8 illustrates an interposer 200 that includes one or more embodiments of the invention. The interposer 200 is an intervening substrate used to bridge a first substrate 202 to a second substrate 204. The first substrate 202 may be, for instance, an integrated circuit die. The second substrate 204 may be, for instance, a memory module, a computer motherboard, or another integrated circuit die. Generally, the purpose of an interposer 200 is to spread a connection to a wider pitch or to reroute a connection to a different connection. For example, an interposer 200 may couple an integrated circuit die to a ball grid array (BGA) 206 that can subsequently be coupled to the second substrate 204. In some embodiments, the first and second substrates 202/204 are attached to opposing sides of the interposer 200. In other embodiments, the first and second substrates 202/204 are attached to the same side of the interposer 200. And in further embodiments, three or more substrates are interconnected by way of the interposer 200.

The interposer 200 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 208 and vias 210, including but not limited to through-silicon vias (TSVs) 212. The interposer 200 may further include embedded devices 214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 200.

In accordance with embodiments of the invention, apparatuses or processes disclosed herein may be used in the fabrication of interposer 200.

Figure 9:
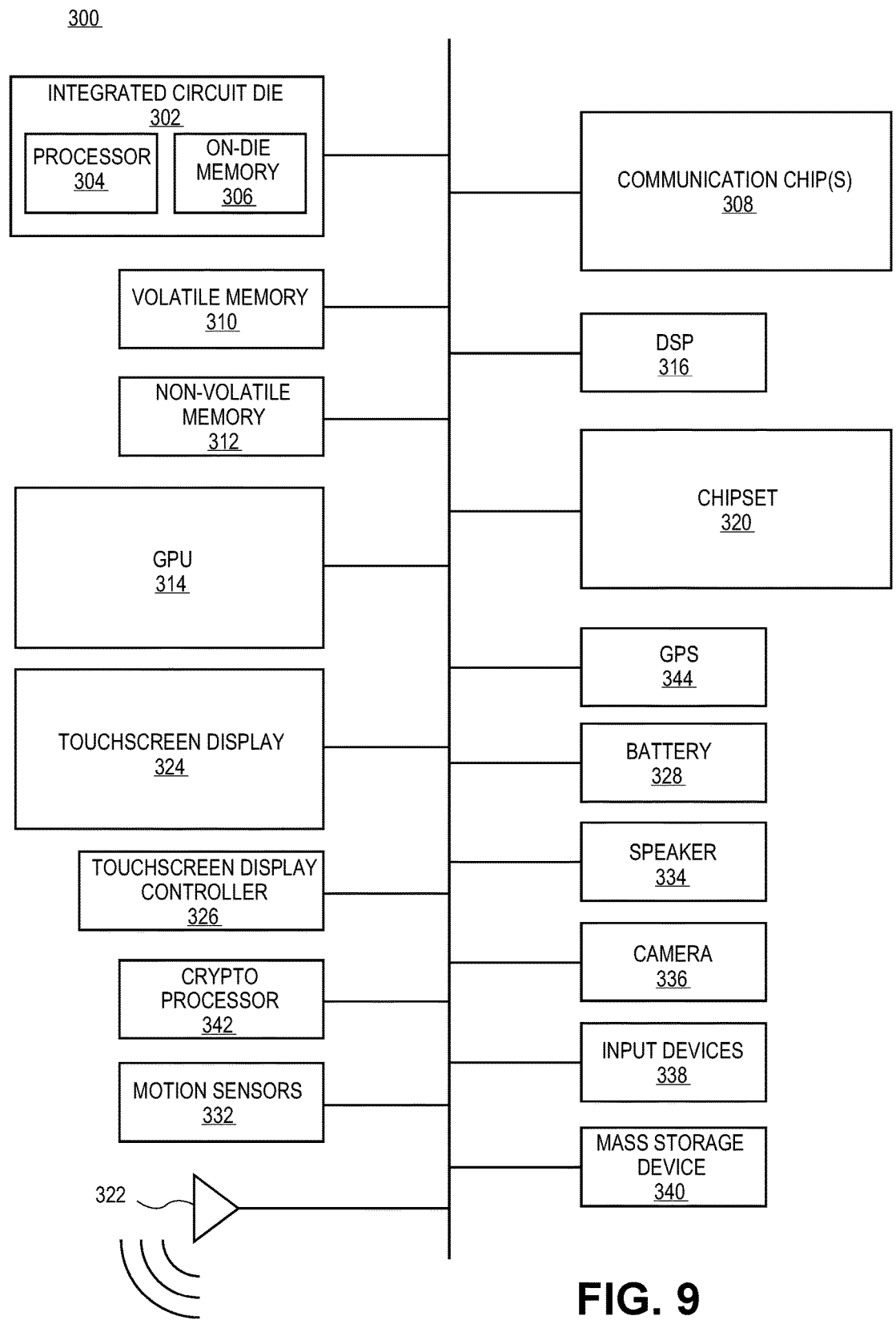
FIG. 9 illustrates an embodiment of a computing device.

FIG. 9 illustrates a computing device 300 in accordance with one embodiment of the invention. The computing device 300 may include a number of components. In one embodiment, these components are attached to one or more motherboards. In an alternate embodiment, these components are fabricated onto a single system-on-a-chip (SoC) die rather than a motherboard. The components in the computing device 300 include, but are not limited to, an integrated circuit die 302 and at least one communication chip 308. In some implementations the communication chip 308 is fabricated as part of the integrated circuit die 302. The integrated circuit die 302 may include a CPU 304 as well as on-die memory 306, often used as cache memory, that can be provided by technologies such as embedded DRAM (eDRAM) or spin-transfer torque memory (STTM or STTM-RAM).

Computing device 300 may include other components that may or may not be physically and electrically coupled to the motherboard or fabricated within an SoC die. These other components include, but are not limited to, volatile memory 310 (e.g., DRAM), non-volatile memory 312 (e.g., ROM or flash memory), a graphics processing unit 314 (GPU), a digital signal processor 316, a crypto processor 342 (a specialized processor that executes cryptographic algorithms within hardware), a chipset 320, an antenna 322, a display or a touchscreen display 324, a touchscreen controller 326, a battery 328 or other power source, a power amplifier (not shown), a global positioning system (GPS) device 344, a compass 330, a motion coprocessor or sensors 332 (that may include an accelerometer, a gyroscope, and a compass), a speaker 334, a camera 336, user input devices 338 (such as a keyboard, mouse, stylus, and touchpad), and a mass storage device 340 (such as hard disk drive, compact disk (CD), digital versatile disk (DVD), and so forth).

The communications chip 308 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 308 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 308. For instance, a first communication chip 308 may be dedicated to shorter range wireless communications such as Wi-Fi and Bluetooth and a second communication chip 308 may be dedicated to longer range wireless communications such as GPS, EDGE, GPRS, CDMA, WiMAX, LTE, Ev-DO, and others.

The processor 304 of the computing device 300, in one embodiment, is a monolithic 3D IC including multiple device layers, that is formed in accordance with embodiments described above. The term "processor" may refer to any device or portion of a device that processes electronic data from registers and/or memory to transform that electronic data into other electronic data that may be stored in registers and/or memory.

The communication chip 308 may also include, in one embodiment, a monolithic 3D IC including multiple device layers, that is formed in accordance with embodiments described above.

In further embodiments, another component housed within the computing device 300 may contain a monolithic 3D IC including multiple device layers in accordance with implementations described above.

In various embodiments, the computing device 300 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

EXAMPLES

Example 1 is a method including forming a first substrate including an integrated circuit device layer disposed between a plurality of first interconnects and a plurality of second interconnects; coupling a second substrate including a memory device layer to the first substrate so that the memory device layer is juxtaposed to one of the plurality of first interconnects and the plurality of second interconnects; and removing a portion of the first substrate.

In Example 2, forming a first substrate of Example 1 includes an integrated circuit device layer disposed between a plurality of first interconnects and a plurality of second interconnects includes forming a first device layer on the first substrate; forming a plurality of first interconnects on the first substrate wherein ones of the plurality of first interconnects are coupled to ones of the plurality of first devices; coupling one of a device layer devoid of a plurality of second devices and a device layer including a plurality of second devices to ones of the plurality of first interconnects, with the proviso that where a device layer devoid of the plurality of second devices is coupled, the method includes forming a plurality of second devices; and forming a plurality of second interconnects on the second device layer wherein ones of the plurality of second interconnects are coupled to ones of the plurality of second devices.

In Example 3, after removing a portion of the first substrate, the method of Example 2 includes forming contacts points to one of ones of the first plurality of interconnects, the contact points operable for connection to an external source.

In Example 4, dimensions of ones of the first plurality of interconnects of Example 2 are larger than dimensions of ones of the second plurality of interconnects.

In Example 5, the plurality of first devices of Example 2 include devices having a higher voltage range than the plurality of second devices.

In Example 6, the plurality of the second devices of Example 2 include devices disposed at a finer pitch than a pitch of the plurality of first devices.

In Example 7, forming a plurality of second interconnects of Example 1 includes forming an interconnect stack including the plurality of second interconnects and a plurality of memory devices embedded therein.

In Example 8, the memory device layer of Example 1 includes DRAM devices.

Example 9 is a three-dimensional integrated circuit formed by any of the methods of Examples 1-8.

Example 10 is an apparatus including a device layer comprising a plurality of first circuit devices disposed between a plurality of first interconnects and a plurality of second interconnects on a substrate wherein ones of the plurality of first interconnects and ones of the plurality of second interconnects are coupled to ones of the plurality of first circuit devices; a memory device layer including a plurality of memory devices juxtaposed and coupled to one of the plurality of first interconnects and the plurality of second interconnects; and contacts points coupled to one of ones of the first plurality of interconnects and ones of the second plurality of interconnects, the contact points operable for connection to an external source.

In Example 11, the device layer of Example 10 includes a first device layer and where the memory device is juxtaposed and coupled to one of the first plurality of interconnects and the second plurality of interconnects, the apparatus further includes a second device layer comprising a plurality of second circuit devices juxtaposed and coupled to the other of the first plurality of interconnects and the second plurality of interconnects.

In Example 12, one of the plurality of first devices and the plurality of second devices of Example 11 include devices having a higher voltage range than the other of the plurality of first devices and the plurality of second devices.

In Example 13, the plurality of the first circuit devices of the first device layer of Example 12 include devices disposed at a finer pitch than a pitch of the plurality of second circuit devices and the plurality of first interconnects are disposed between a carrier substrate and the first device layer.

In Example 14, the contact points of Example 12 are coupled to ones of the plurality of second interconnects.

In Example 15, a plurality of memory devices of Example 11 are disposed within one of the plurality of first interconnects and the plurality of second interconnects.

In Example 16, the contact points of Example 12 include circuit contact points, the apparatus further including a package comprising package contact points coupled to the circuit contact points.

Example 17 is a method including forming a first device layer on a first substrate, the device layer including a plurality of first devices; forming a plurality of first interconnects wherein ones of the plurality of first interconnects are coupled to ones of the plurality of first devices; forming a second device layer juxtaposed to the plurality of first interconnects, the second device layer including a plurality of second devices; forming a plurality of second interconnects juxtaposed to the second device layer; coupling a second substrate including a memory device layer to the first substrate so that the memory device layer is juxtaposed to the plurality of second interconnects; and removing a portion of the first substrate while retaining the first device layer.

In Example 18, the method of Example 17 includes forming contacts points to the first plurality of interconnects, the contact points operable for connection to an external source.

In Example 19, the plurality of first devices of Example 17 include devices having a higher voltage range than the plurality of second devices.

In Example 20, the plurality of the second devices of Example 17 include devices disposed at a finer pitch than a pitch of the plurality of first devices.

In Example 21, forming a plurality of second interconnects of Example 17 includes forming an interconnect stack comprising the plurality of second interconnects and a plurality of memory devices embedded therein.

Example 22 is a three-dimensional apparatus made by the method of any of Examples 17-21.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
a first device layer comprising a plurality of first circuit devices disposed between a plurality of first interconnects and a plurality of second interconnects on a substrate wherein ones of the plurality of first interconnects and ones of the plurality of second interconnects are coupled to ones of the plurality of first circuit devices;
a second device layer comprising a plurality of second circuit devices juxtaposed and coupled to the other ones of the first plurality of interconnects and the second plurality of interconnects;
a memory device layer comprising a plurality of memory devices juxtaposed and coupled to one of the plurality of first interconnects and the plurality of second interconnects; and
contact points coupled to one of ones of the first plurality of interconnects and ones of the second plurality of interconnects, the contact points operable for connection to an external source,
wherein one of the first device layer and the second device layer comprises GaN or GaAs devices comprising a higher voltage range than silicon-based devices of the other of the first device layer and the second device layer, and wherein the silicon-based devices have a finer pitch than a pitch of the GaN or GaAs devices.

2. The apparatus of claim 1, wherein the plurality of first interconnects are disposed between a carrier substrate and the first device layer.

3. The apparatus of claim 1, wherein the contact points are coupled to ones of the plurality of second interconnects.

4. The apparatus of claim 1, wherein a plurality of memory devices are embedded in one of the plurality of first interconnects and the plurality of second interconnects.

5. The apparatus of claim 1, wherein the contact points comprise circuit contact points, the apparatus further comprising a package comprising package contact points coupled to the circuit contact points.

* * * * *